US006563736B2

(12) United States Patent
Hsu et al.

(10) Patent No.: US 6,563,736 B2
(45) Date of Patent: May 13, 2003

(54) FLASH MEMORY STRUCTURE HAVING DOUBLE CELLED ELEMENTS AND METHOD FOR FABRICATING THE SAME

(75) Inventors: Louis L. Hsu, Fishkill, NY (US); Rajiv V. Joshi, Yorktown Heights, NY (US); Carl Radens, Langrangeville, NY (US); Jack A. Mandelman, Stormville, NY (US); William R. Tonti, Essex Junction, VT (US)

(73) Assignee: IBM Corporation, Armonk, NY (US)

( * ) Notice: Subject to any disclaimer, the term of this patent is extended or adjusted under 35 U.S.C. 154(b) by 0 days.

(21) Appl. No.: 09/860,736

(22) Filed: May 18, 2001

(65) Prior Publication Data

US 2002/0171101 A1 Nov. 21, 2002

(51) Int. Cl.$^7$ ............................................ G11C 16/04
(52) U.S. Cl. ......................... 365/185.18; 365/185.02; 257/317
(58) Field of Search ................................ 365/185, 185.3, 365/185.1, 185.18, 185.29, 185.02, 185.01, 185.06; 257/317, 316, 315

(56) References Cited

U.S. PATENT DOCUMENTS

| 5,010,028 | A | * | 4/1991 | Gill et al. .................... 437/43 |
| 5,060,195 | A | * | 10/1991 | Gill et al. .................... 365/185 |
| 5,748,538 | A | * | 5/1998 | Lee et al. ............... 365/185.06 |
| 5,986,934 | A | * | 11/1999 | Kao et al. ............... 365/185.18 |
| 6,133,098 | A | * | 10/2000 | Ogura et al. ................. 438/267 |
| 6,211,547 | B1 | * | 4/2001 | Kao et al. .................... 257/317 |
| 6,248,633 | B1 | * | 6/2001 | Ogura et al. ................. 438/267 |
| 6,323,089 | B1 | * | 11/2001 | Kao et al. .................... 438/260 |
| 6,359,807 | B1 | * | 3/2002 | Ogura et al. ........... 365/185.18 |
| 6,366,500 | B1 | * | 4/2002 | Ogura et al. ........... 365/185.29 |

* cited by examiner

*Primary Examiner*—Carl Whitehead, Jr.
*Assistant Examiner*—Laura M Schillinger
(74) *Attorney, Agent, or Firm*—Dilworth & Barrese, LLP (57) ABSTRACT

A flash memory array having a plurality of bitlines, at least one wordline and a plurality of flash memory flash memory elements, wherein each flash memory element includes two transistors for storing two bits, and wherein each flash memory element is positioned between a pair of adjacent bitlines. A method is also presented for fabricating the flash memory array having the plurality of flash memory elements, wherein each flash memory element is configured for storing two bits.

5 Claims, 8 Drawing Sheets

FLASH MEMORY STRUCTURE HAVING DOUBLE CELLED ELEMENTS AND METHOD FOR FABRICATING THE SAME

FIELD OF THE INVENTION

The present invention relates to the field of integrated circuit design. Specifically, it relates to a flash memory structure and method for fabricating the same. The flash memory structure includes memory elements having two cells configured in an array in which the two cells operate as a cell pair or as independent cells.

BACKGROUND OF THE INVENTION

Flash memory provides nonvolatile memory in which blocks of the flash memory are erasable in a flash operation. Two well-known types of circuitry employed for flash memory are NAND and NOR types. There are a variety of device structures employed for flash memory, including two well known structures, stack gate and split gate, each structure having inherent strengths and weaknesses. A stack gate device has its channel region covered by a floating gate that is overlapped by a control gate. In a split gate device a portion of the channel is controlled directly by the control gate, while the remaining portion of the channel is controlled by the floating gate, which is modulated by the control gate.

In a conventional high-density, high speed NOR type flash memory the random access speed is approximately 30 ns, the write speed is approximately 1 $\mu$s to 10 $\mu$s, the write/erase endurance is greater than $10^6$ cycles, the data holding time is greater than 10 years and the cell size is about 0.5 $\mu m^2$. In a commonly used nMOS flash memory device, a gate oxide is formed in the range of 7 nm to 12 nm and the channel is formed to have a channel length approximately 0.25 nm to 0.5 nm.

There are a variety of programming methods employed for programming the flash memory by writing the desired information to the cells of the flash memory. In the most widely used method, channel hot electron injection programming, during a write cycle the control gate of a cell being written to is biased to a high voltage level of approximately 7V to 9V while the source is maintained at ground and the drain is biased to 3V to 5V. The hot electrons generated at the drain side are injected into the floating gate to cause the threshold voltage (Vt) of the device to rise, thereby writing to the cell.

In another programming method, i.e., Fowler Nordheim (FN) tunnel programming, a relatively high control gate voltage of approximately 12V to 20V is needed, while both of the drain and source gates are tied to ground. The high voltage needed for writing to the flash memory cell is required to form an electric field, of approximately 12 mV/cm in order to facilitate tunneling of electrons from an inversion layer in the channel area into the floating gate. For an erasure operation, a voltage as high as 12V is applied to the source gate for a source gate erase while the substrate is grounded and the drain gate is left floating. Alternatively, a negative voltage of −8V to −9V is applied to the control gate, a positive voltage of 3V to 5V is applied to the drain node and the source node is left floating.

Flash memory provides the advantage of maintaining storage of data even when power is removed and performing block data erasure so that a partial or full memory macro can be reprogrammed again after the original data is completely erased. However, a relatively slow programming speed (and write speed) is typically associated with flash memory. In comparison, the random write access time is approximately 1ns for a state of the art SRAM and approximately 10 ns for a DRAM. Therefore, flash memory is usually used for storing data for read operations and is not used for true high-speed random read/write access applications. Once the stored data needs to be altered a relatively long programming time is required.

Flash memory typically requires that the threshold voltage (Vt) difference between a programmed cell having a state "one" and an un-programmed cell having a state "zero" be minimally 2V. This relatively high Vt difference is needed because: (1) most flash memory designs use a direct sensing technique that requires sufficient Vt difference between a programmed cell or an un-programmed cell for sensing; (2) a high Vt difference helps to prevent degradation, which results in a shortened life-time for the flash memory, due to Vt disturbances caused by read, write and erase operations; and (3) when Vt for a programmed cell is not high enough an array formed by a plurality of flash memory cells is subjected to a DC leakage that is large and would not be tolerable for a low-power operation involving low Vt levels.

The programming speed associated with flash memory is relatively slow since it depends upon an amount of time required to store an amount of charge required on the floating gate to produce a high enough Vt to produce a meaningful Vt shift when a cell changes from a state "zero" to a state "one". Typically, flash memory cells are overprogrammed in order to guarantee a uniform Vt of the programmed cells, further increasing the time required to program a cell and decreasing programming speed.

There are problems typically associated with the accuracy of flash memory. Disturbances, such as unintentional voltage coupling by adjacent cells due to read, write and erase operations, may cause the Vt of programmed cells to deviate from the required Vt, generally causing a read or write failure. Flash memory cells, having an inherently small size, are often arranged in a cross-point array format. The sensing scheme used for a cross-point array is usually via an open bitline architecture using single rail direct sensing or dual rail differential sensing techniques, both of which require a reference voltage generator. An insufficient Vt difference may result in a sense margin too small to be reliable, generally causing a read or write failure. Furthermore, a marginal sense signal is susceptible to coupling noise, further compromising the data integrity of the flash memory. In general, the reliability of the flash memory is limited due to typical inherent sensing limitations associated with single polarity data.

Typically, during the fabrication of a prior art stack gate flash memory cell, the floating gate is patterned in order to isolate it from the control gate, after which the control gate is patterned in a separate patterning step. Each patterning step requires a special mask and consumes time, adding to the fabrication costs.

SUMMARY

It is an aspect of the present invention to provide a flash memory system having an array of flash memory elements having two cells in which the write speed of the flash memory system is enhanced.

It is an aspect of the present invention to provide a flash memory system having an array of flash memory elements having two cells in which the write speed is enhanced without compromising reliability and durability of the flash memory.

It is an aspect of the present invention to provide a flash memory system having an array of flash memory elements having two cells in which the storage capacity of the flash memory system is increased.

It is a further aspect of the present invention to provide a flash memory system having a plurality of double cell memory elements arranged in an array, wherein the two cells of each element function as two independent cells storing independent data or as twin cells storing differential data.

It is an aspect of the present invention to provide a flash memory system comprising an array of flash memory elements having two cells, wherein each cell operates reliably with a reduced threshold voltage (Vt) difference to reduce the programming time.

It is a further aspect of the present invention to provide a method for fabricating a flash memory array having a plurality of double cell elements in which the floating gate and the control gate of each cell are formed in a single patterning step.

It is still a further aspect of the present invention to provide a method for fabricating a flash memory array having a plurality of double cell elements in which the floating gate and the control gate are formed to be isolated from the respective floating gate and control gate of adjacent cells, and wherein the control gates of adjacent cells are joined by a conducting connection.

Accordingly, in an embodiment of the present invention a flash memory array is presented having a plurality of bitlines and a plurality of flash memory elements, wherein each element is positioned between a pair of adjacent bitlines of the array. Each flash memory element has first and second transistors, wherein the first transistor contacts a bitline of a pair of adjacent bitlines, and the second transistor contacts the other bitline of the pair of adjacent bitlines. In one embodiment, the bitlines of the pair of adjacent bitlines carry a differential signal pair and one sense amplifier is provided to sense the pair of adjacent bitlines. In another embodiment, the bitlines of the pair of adjacent bitlines carry independent signals, and a sense amplifier is provided for each of the bitlines of the pair of adjacent bitlines.

In another embodiment of the present invention, a memory system is presented having a plurality of flash memory elements, arranged in an array including a plurality of bitlines, wherein each element is positioned between a pair of adjacent bitlines. Each flash memory element has first and second transistors, wherein the first transistor contacts a bitline of a pair of adjacent bitlines, and the second transistor contacts the other bitline of the pair of adjacent bitlines.

Further still, in another embodiment of the present invention, a method is presented for fabricating a flash memory array having a plurality of flash memory elements. Each element has at least one control gate and at least one floating gate. The method entails forming each control gate and each floating gate simultaneously. Each control gate and floating gate is formed to be isolated from adjacent control gates and floating gates respectively. Adjacent control gates are then joined by a conducting connection.

BRIEF DESCRIPTION OF THE FIGURES

FIGS. 5–7A are cross-sectional views of a portion of a flash memory array illustrating a preferred process for fabricating flash memory elements having two cells of a flash memory array according to the present invention;

FIGS. 8–10A are cross-sectional views of a portion of a flash memory array illustrating a preferred process for fabricating flash memory elements having two cells of a flash memory array according to the present invention;

FIGS. 11–12A are cross-sectional views of a portion of a flash memory array illustrating a preferred process for fabricating flash memory elements having two cells of a flash memory array according to the present invention;

DETAILED DESCRIPTION OF THE INVENTION

Figure 1:
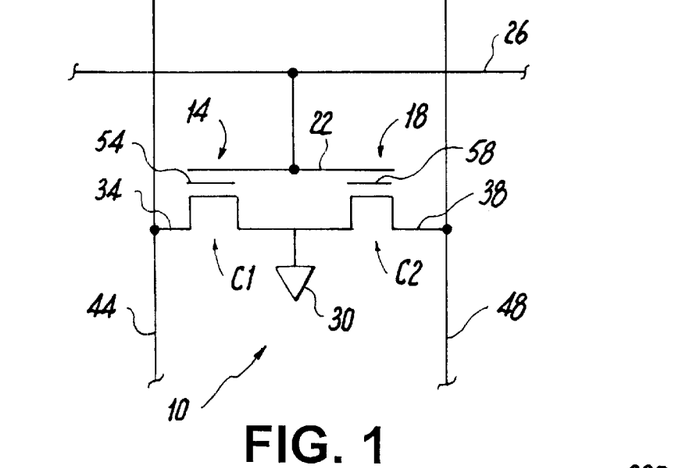
FIG. 1 is a circuit diagram of an element of a flash memory system having two cells according to the present invention.

The present invention provides a flash memory structure including a plurality of memory elements wherein each memory element of the array is double celled. The term "double cell" describes an element having a transistor pair, each cell of the double cell being associated with one transistor of the transistor pair. The double celled elements are configured in an array to operate either as a cell pair or as two independent cells. FIG. 1, wherein like reference numerals refer to identical or similar elements throughout the several views, shows a circuit design for a double cell memory element 10 of a flash memory array.

The element 10 includes a transistor pair including a first transistor 14 associated with a first cell C1 and a second transistor 18 associated with a second cell C2. The transistors 14, 18 of the transistor pair share a control gate 22 that is tied to a wordline 26. The transistors 14, 18 of the transistor pair each have a source side that is connected to a source 30 such as a ground or an appropriate source voltage. The transistors 14, 18 are shown in FIG. 1 to be connected at their respective source sides to the same source (common source) 30. Each transistor 14, 18 has a drain side 34 and 38, respectively. The drain side 34 of transistor 14 is connected to bitline 44. The drain side 38 of transistor 18 is connected to bitline 48. Transistor 14 further includes a floating gate 54, and transistor 18 further includes a floating gate 58. Floating gates 54 and 58 are formed to be separate from each other as further described below.

Upon activation of the contacting bitline 44 and activation of the contacting wordline 26, the floating gate 54 of transistor 14 is programmed, resulting in a programmed cell C1. Upon activation of the contacting bitline 48 and activation of the contacting wordline 26, the floating gate 58 of transistor 18 is programmed, resulting in a programmed cell C2. The voltage for a programmed cell must reach a sufficient threshold voltage (Vt) for allowing a sense amplifier sensing the voltage to differentiate between a programmed and an un-programmed cell.

Figure 2:
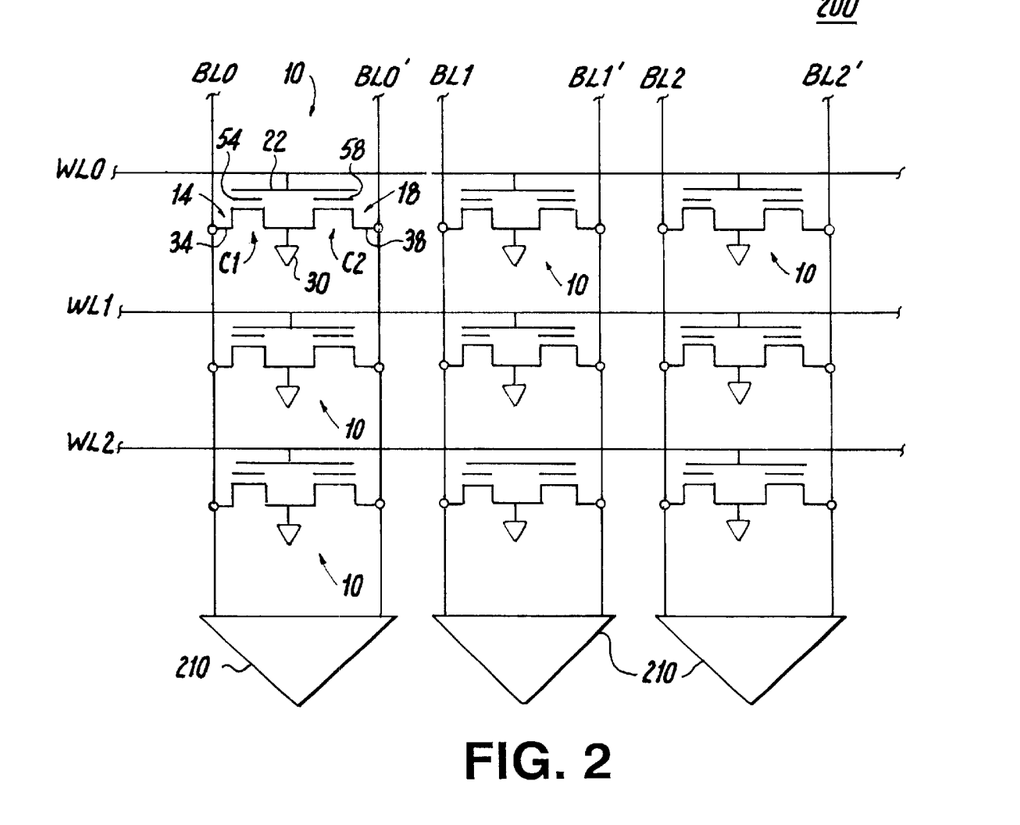
FIG. 2 is a circuit diagram of an array of elements in a flash memory system having two cells according to a first embodiment of the present invention.

A flash memory array 200 of a flash memory structure in accordance with the first embodiment of the present invention is shown in FIG. 2. The array 200 includes a plurality of elements 10, wherein for each element 10 the transistor pair 14, 18 is coupled via the shared control gate 22 to one wordline of a plurality of wordlines WL0, WL1, WL2, etc. Each transistor of the transistor pair is coupled via its drain side to one bitline of a pair of adjacent bitlines of a plurality of adjacent bitlines pairs (BL0, BL0'), (BL1, BL1'), (BL2, BL2'), etc. so that each element is coupled to a bitline pair. The bitline pairs (BL0, BL0'), (BL1, BL1'), (BL2, BL2') etc. each carry a differential signal such that one bitline (for example, BL0) of the bitline pair carries a true signal and the other bitline of the bitline pair (for example, BL0') carries a complement signal. Thus, during programming the cells of each element 10 store a true/complement pair of values.

As shown in FIG. 2, each element 10 of the array 200 includes two cells that store data from a bitline pair that includes a true bitline and a complementary bitline. One sense amplifier 210 is provided for each bitline pair (BL0, BL0'), (BL1, BL1'), (BL2, BL2'), etc. The sense amplifier 210 is a differential sense amplifier, such as a CMOS cross-couple differential amplifier. The cross-couple differential amplifier uses a common noise rejection technique, allowing it to tolerate a small signal margin, and therefore a small Vt difference.

During programming of the flash memory array 200, the threshold voltage of one of the cells of each element is raised. Programming of the exemplary element 10 that is coupled to wordline 26 and bitline pair (44, 48) will be used to describe programming of each element of the plurality of elements of the array 200. To program the exemplary element 10 to store a state "1" (high), the true cell C1 is programmed by boosting wordline 26 and bitline 44 to a high while bitline 48 is left floating, causing the floating gate of C1 to be programmed. To program the exemplary element 10 to store a state "0" (low), the complementary cell C2 is programmed by boosting wordline 26 and bitline 48 to a high while bitline 44 is left floating, causing the floating gate of C2 to be programmed.

Before programming the cells of the elements 10 of the flash memory array 200, all cells in the array 200 are completely erased. To avoid over-erasing of any cells and to provide uniform erasure of each cell, a full programming of each cell in the array 200 is performed prior to performing the erase operation on the cells of the array 200. The full programming causes both cells of each flash memory element to be programmed to a high state, including cells that were originally in a high state, as a cell programmed in a high state does not go higher once it has reached saturation.

The threshold voltage needed for programming cells of array 200 is relatively low due to the sensing by sense amplifier 210 of a differential signal pair during a read operation. Leakage is suppressed by holding the voltage of each control gate associated with an unselected wordline to a negative level.

Figure 3:
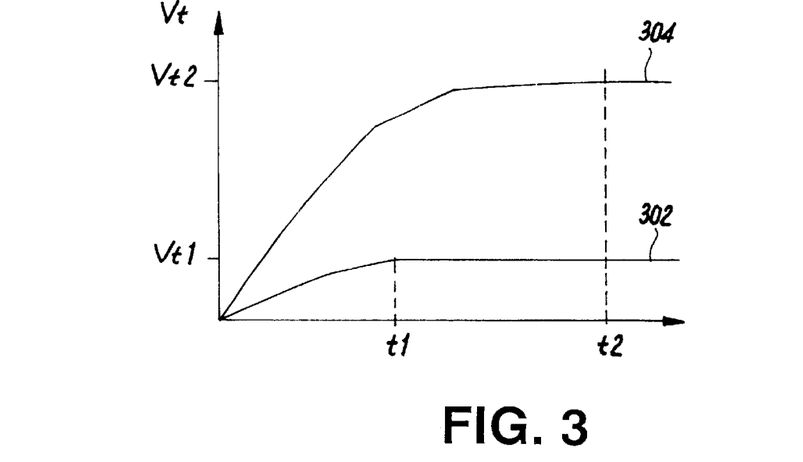
FIG. 3 is a graph comparing programming speed of a cell of an element in a flash memory system according to the first embodiment of the present invention, and a prior art flash memory cell.

FIG. 3 illustrates a comparison of programming times for a flash memory element according to the first embodiment of the present invention, as shown in FIG. 2, and a conventional flash memory element. At time t1, as shown by curve 302, a cell C1, C2 of element 10 has reached the threshold voltage, Vt1, needed for being programmed. At time t2, as shown by curve 304, a cell of a prior art flash memory element has reached the threshold voltage, Vt2, needed for being programmed. As seen in FIG. 3, Vt1 is lower than Vt2, and the programming time t1 for programming a cell C1, C2 of element 10 is significantly less than the programming time t2 for programming a conventional flash memory element. For conventional flash memory array, an over-programming of the flash memory cells is performed for guaranteeing a uniform Vt of the programmed cells, further extending the programming time t2. Due to the low saturated Vt1 of the first embodiment of the present invention, a significant improvement in the write speed is achieved.

The differential sensing technique, such as a CMOS cross-couple differential sensing technique, used for the first embodiment of the present invention tolerates a small signal margin. Due to its common noise rejection characteristic, a small Vt is acceptable. Furthermore, as twin cells are built side-by-side, process related variations such as dimensions, diffusions and temperature are easily cancelled out. The sensing quality and reliability associated with the differential sensing technique of the first embodiment is typically superior to techniques using a generated reference voltage level.

Figure 4:
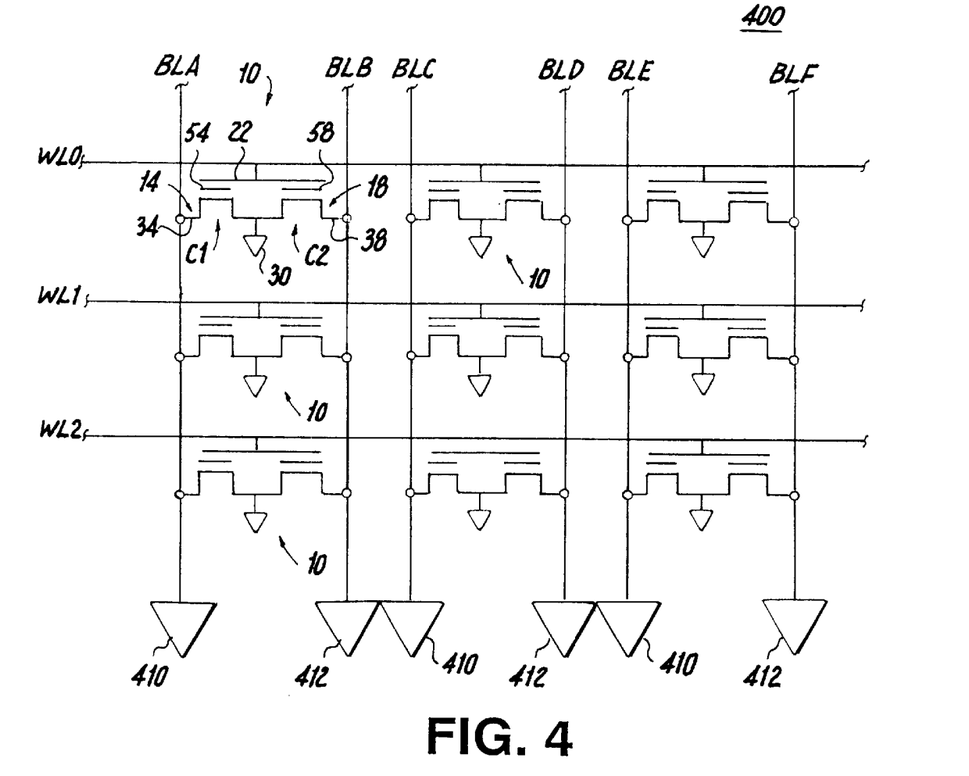
FIG. 4 is a circuit diagram of an array of elements in a flash memory system having two independent cells according to a second embodiment of the present invention.

A flash memory array 400, of a flash memory structure in accordance with a second embodiment of the present invention, is shown in FIG. 4. The array 400 includes a plurality of elements 10, wherein for each element 10 the transistor pair 14, 18 is coupled via the shared control gate 22 to one wordline of a plurality of wordlines WL0, WL1, WL2, etc. Each transistor of the transistor pair is coupled via its drain side to a bitline BLA-F of a pair of adjacent bitlines. Each bitline BLA-F is an independent bitline. Thus, each transistor of the transistor pair is coupled to an independent bitline.

As shown in FIG. 4, each element of the array 400 includes two cells C1, C2, each cell C1, C2 storing data from an independent bitline. A sense amplifier 410 is provided for each bitline BLA-F. The sense amplifier 410 is a single-end sense amplifier. Since each of the two bits stored by each element 10 is sensed independently by one sense amplifier 410, each cell of each element 10 must be programmed fully to have a high Vt, thus requiring a long program time. The advantage of the second embodiment is that each element 10 of the array 400 has two cells C1, C2, each storing an independent bit, thus providing a high density of storage.

An array in accordance with the first embodiment or in accordance with the second embodiment can be configured using the same flash memory element 10 as shown in FIG. 1. In comparison, the advantage of the first embodiment of the present invention is a reduced program time and enhanced read reliability. The advantage of the second embodiment is high storage density. Thus, the element 10 provides versatility in that it can be implemented in an array of the first or second embodiment of the present invention, in accordance with the objectives of the application.

A description of the preferred method for fabricating the double celled flash memory element 10 will now be provided. The same fabrication method is used for simultaneously fabricating all of the double celled flash memory elements 10 of the flash memory arrays 200, 400. With reference to FIGS. 5–12B there is shown a portion of a flash memory array illustrating a preferred process for fabricating flash memory double celled elements 10 of a flash memory array according to the present invention.

Figure 5:
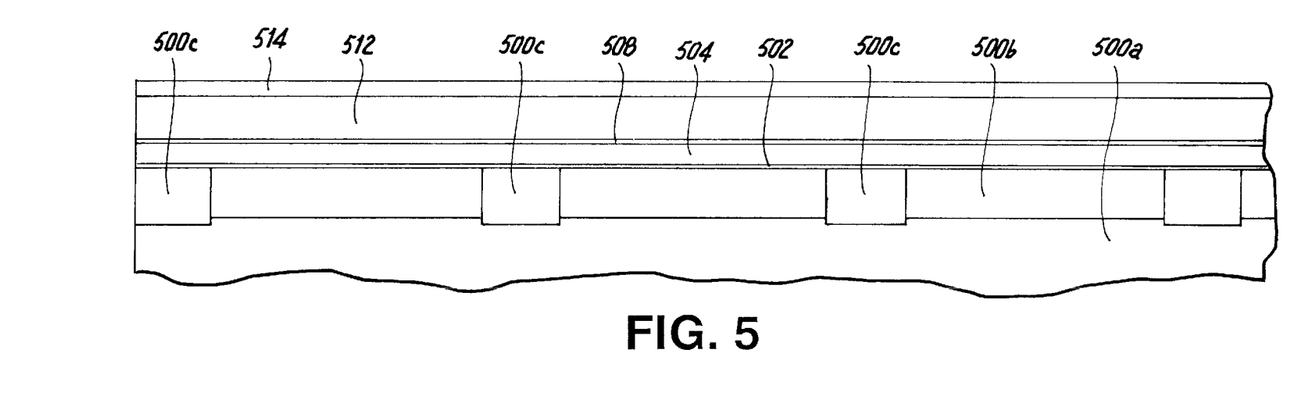

With reference to FIG. 5, a silicon substrate 500 is provided having a heavily n+doped region 500a and a p-well region 500b in which shallow trench isolations 500c are formed. A first gate oxide 502, i.e., a dielectric layer such as thermal-oxide, is formed on top of the substrate. A first gate material 504 such as a Chemical Vapor Deposition (CVD) polysilicon layer is deposited on the first gate oxide 502. A first patterning of the floating gate material 504 is performed by forming islands in the horizontal direction, each island being isolated from the other islands. Each island corresponds to one row of an array of the flash memory structure. FIG. 5 shows a portion of one row. A second gate oxide 508, i.e., a dielectric layer such as an inter-poly-oxide layer, is formed on top of the patterned floating gate islands. A second gate material 512, such as n+dope polysilicon, with a cap layer 514, such as nitride, is deposited on the top of the structure.

Figure 6:
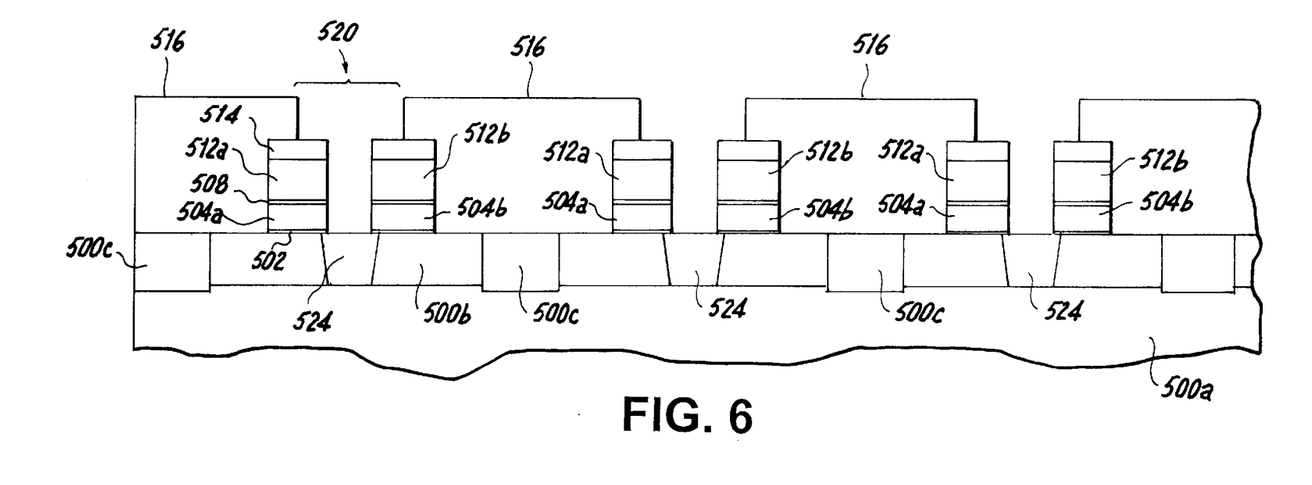

With reference to FIG. 6, a stack of gate material, including layer 514, control gate material 512, second gate oxide 508, floating gate material 504 and first gate oxide 502, is etched sequentially in the vertical direction to the silicon substrate in a single etching step. Thus, the floating gates 504a, 504b are formed by first patterning the islands of the floating gate material 504 in the horizontal direction, and then patterning the floating gate material 504 together with the control gate material 512 in the vertical direction. The single etching step forms the floating gate 504a and control gate 512a of each cell C1 to be isolated from the floating gate 504b and control gate 512b, respectively, of adjacent cell C2. In the single etching step, the floating gates 504a, 504b and control gates 512a, 512b of cells C1, C2, respectively, are formed simultaneously.

In the prior art, the floating gate associated with each cell is first patterned. Once the floating gate is formed for each cell, the control gate is formed to extend across the tops of the floating gates of adjacent cells. The separate formation of the floating gate and the control gate is to ensure that the floating gate of each cell is isolated, while the control gate is shared with adjacent cells.

In the fabrication process of the present invention, as noted above, the floating gates 504a, 504b and the control gates 512a, 512b of element 10 are patterned simultaneously, using one etching step. The result is that the floating gate 504a, 504b and the control gate 512a, 512b of adjacent cells C1, C2 of element 10 are isolated from each other.

After etching as described above, a first mask 516, i.e., a block out mask, is used to open a source region 520 for an n+ implant to form a diffusion region 524 connected to the n+ bulk region 500a of the substrate 500.

Figure 7A:
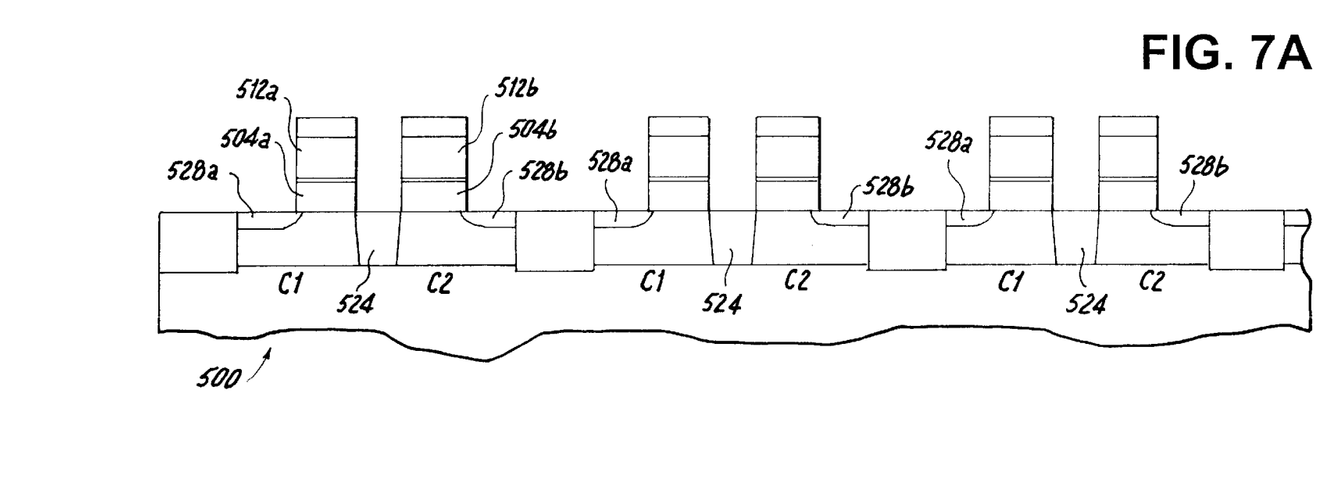

Referring to FIG. 7A, after removing the first mask 516, lightly dope diffusion (LDD) drain regions 528A, 528B are formed by an n+ implant. Each of the drain regions 528A, 528B is associated with one of the two cells C1, C2 of the element 10.

Figure 7B:
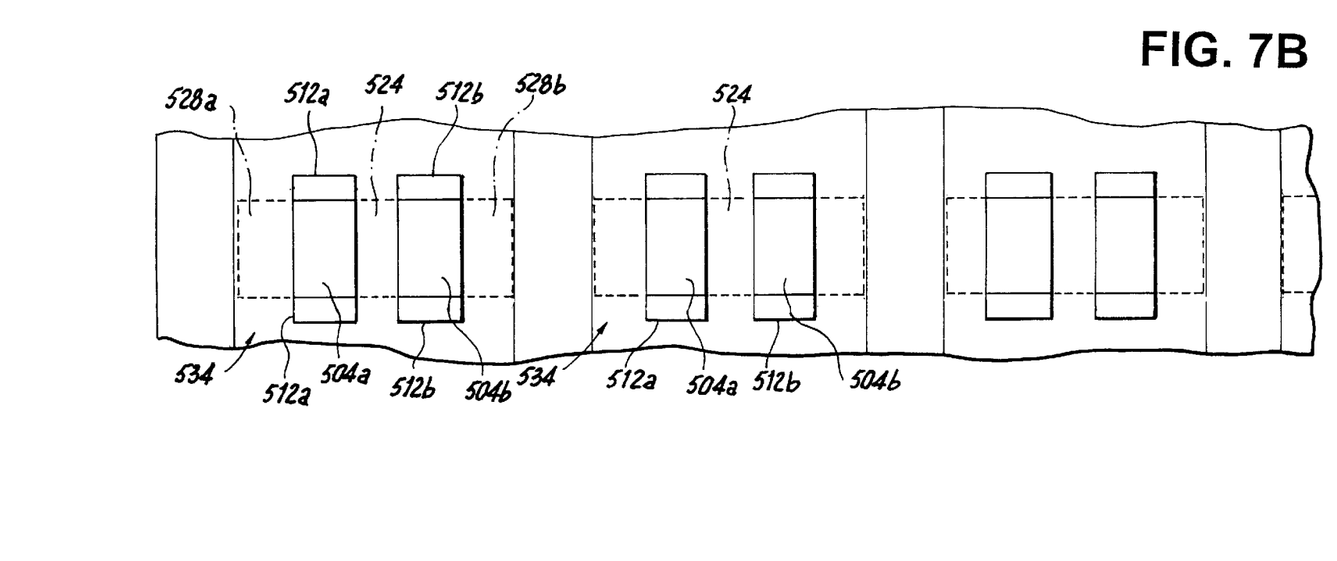
FIG. 7B is a top view shown partially in phantom of a flash memory array illustrating a preferred process for fabricating flash memory elements having two cells of a flash memory array according to the present invention.

FIG. 7B is a top view, shown partially in phantom, showing an active area region 534 along which the island was horizontally patterned.

Figure 8:
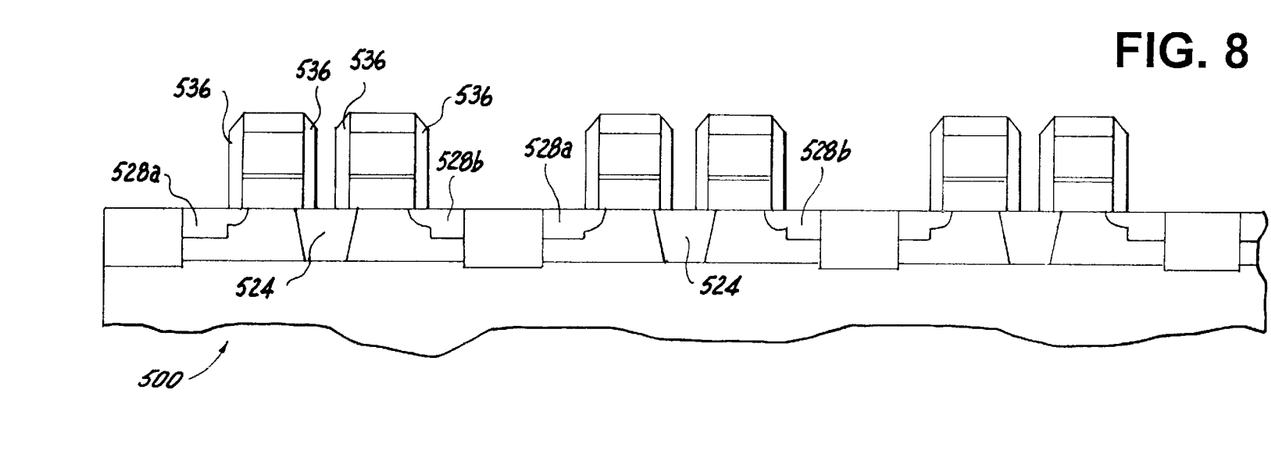

Referring to FIG. 8, sidewall spacers 536 are formed, after which a deeper source/drain junction implant is applied to the drain regions 528A, 528B. In addition, the source junction 520 is enhanced.

Figure 9:
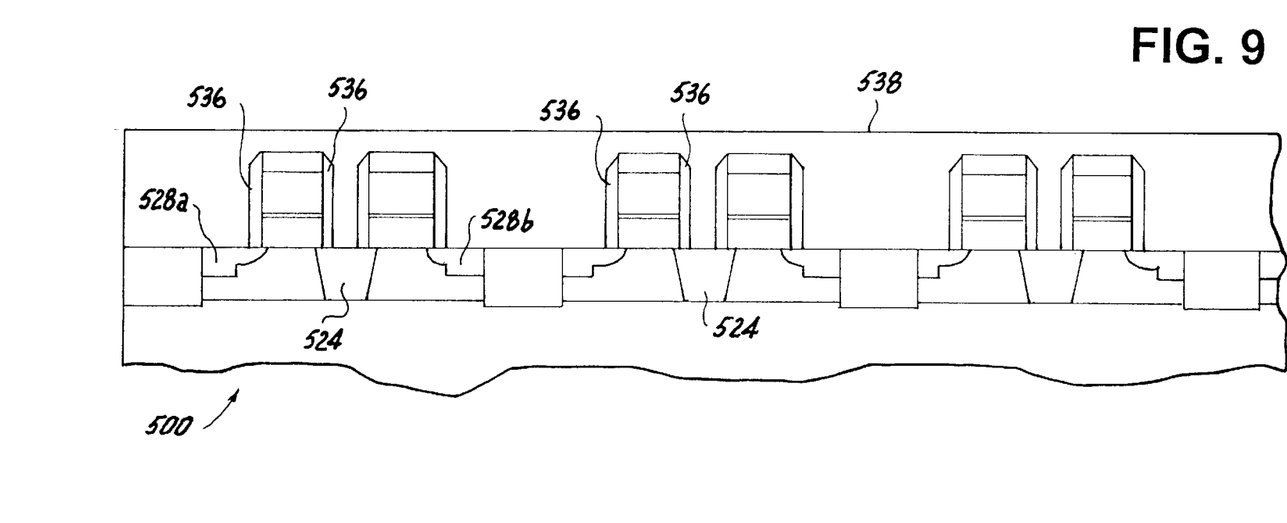

Referring to FIG. 9, a dielectric material 538 is deposited and planarized for providing insulation.

Figure 10A:
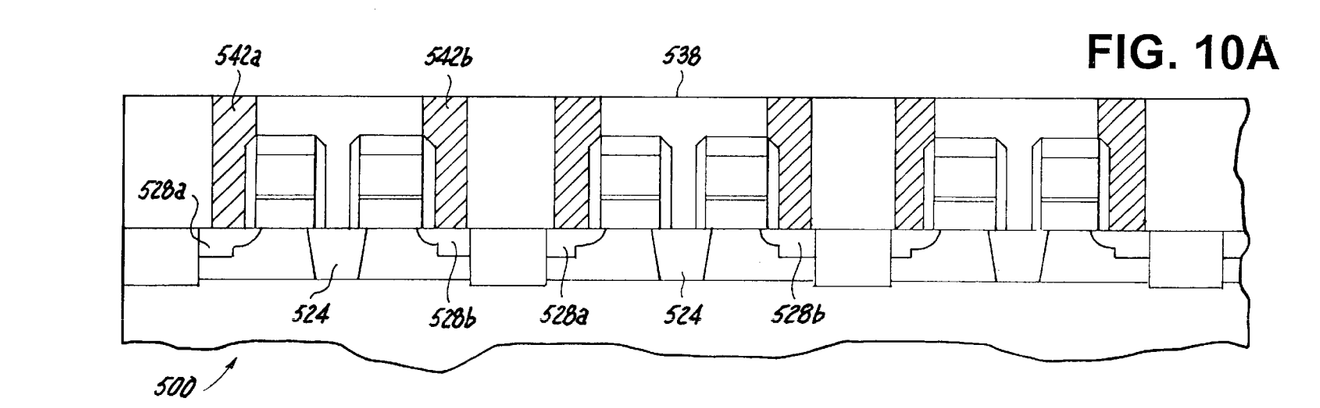
Figure 10B:
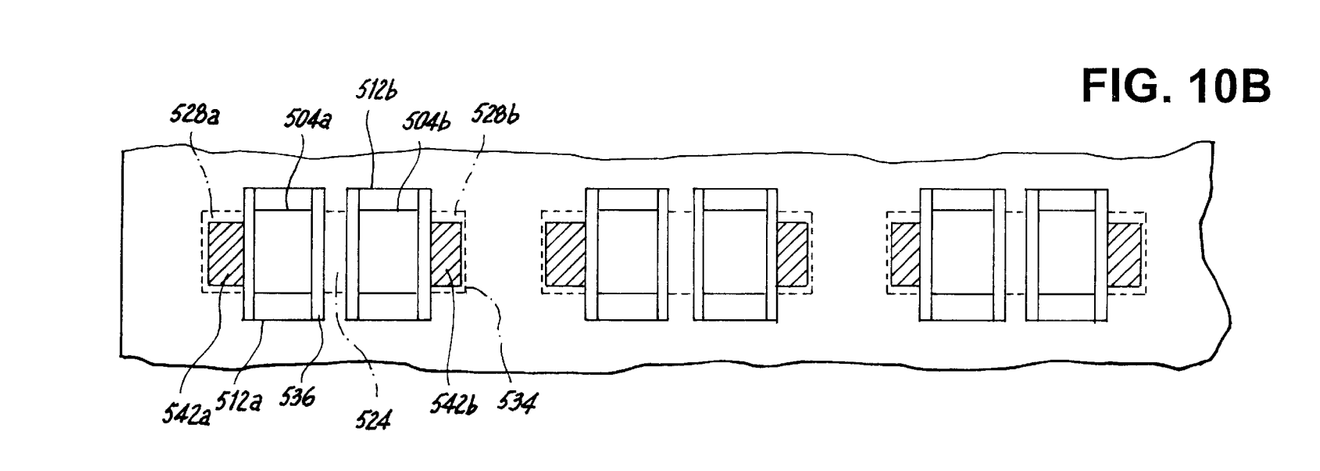
FIG. 10B is a top view shown partially in phantom of a flash memory array illustrating a preferred process for fabricating flash memory elements having two cells of a flash memory array according to the present invention.

Referring to FIGS. 10A, 10B, contacts 542a, 542b are formed for contacting the drain regions 528a, 528b, respectively. The contacts 542a, 542b are formed, for example, of tungsten or aluminum studs. A top view shown partially in phantom of the active region 534 is provided in FIG 10B.

Figure 11:
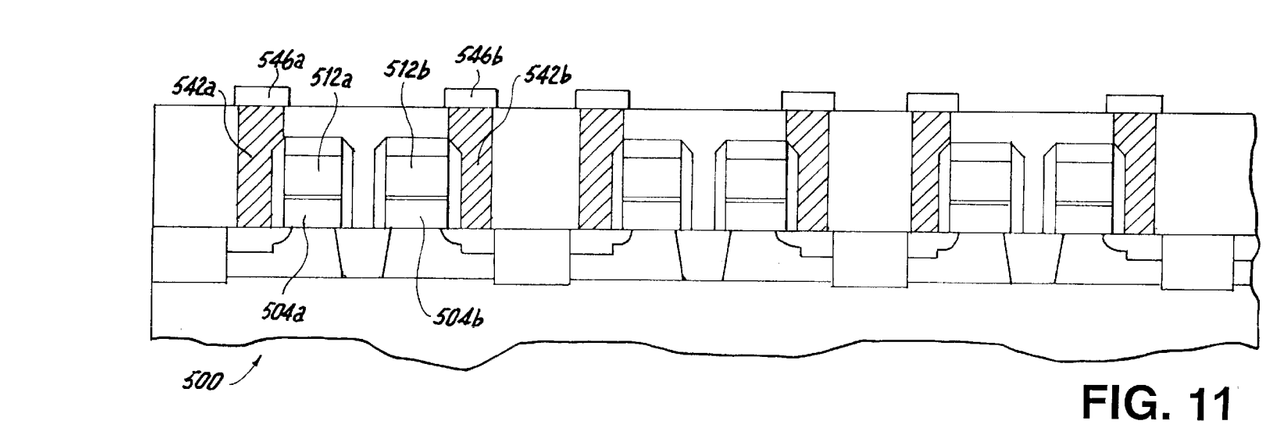

Referring to FIG. 11, bitlines 546a, 546b are formed in contact with contacts 542a, 542b respectively.

Figure 12A:
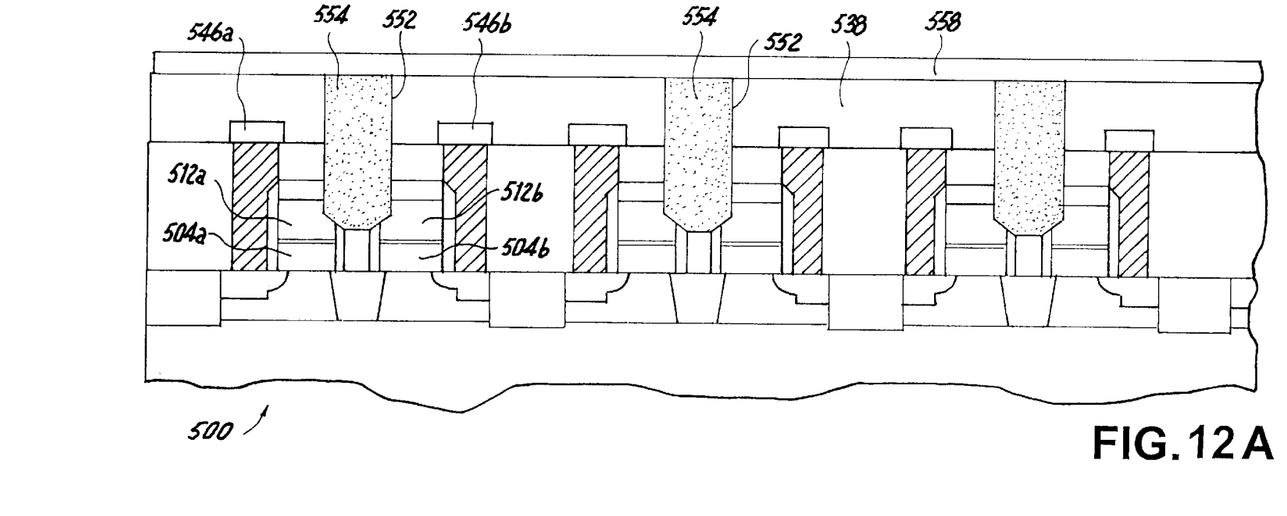
Figure 12B:
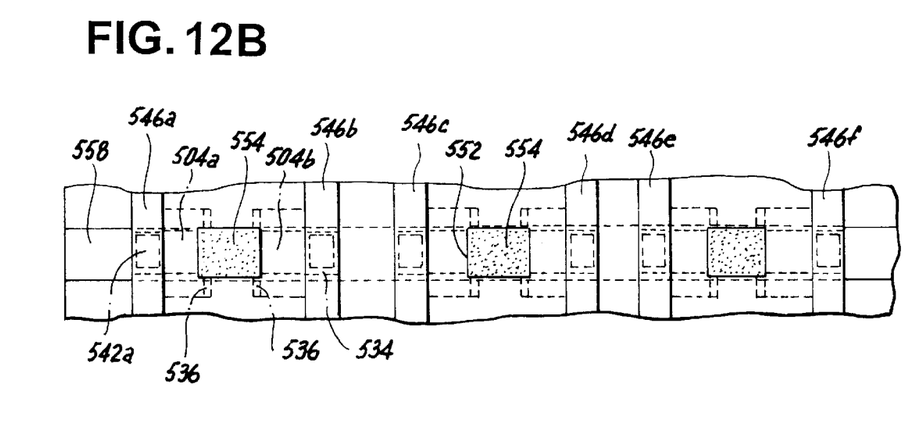
FIG. 12B is a top view shown partially in phantom of a flash memory array illustrating a preferred process for fabricating flash memory elements having two cells of a flash memory array according to the present invention.

Referring to FIGS. 12A, 12B, a thick insulating material 550, such as dielectric CVD oxide, is deposited. Next, a via 552 is formed by etching the insulating material 550, the first insulating material 538, the cap layer 514, and over etching into the control gate material 512. Next, the via 552 is filled with a conductive material, and is polished (i.e., employing chemical mechanical polish (CMP)) back to the top surface of the insulating material 550 to form a contact 554. A wordline 558 is formed to contact the contact 554, and adjacent contacts 554 of adjacent elements 10 in a row of an array, thus providing contact between the wordline 558 and the control gate 512a of each cell of each element 10 lying in the array row. A top view shown partially in phantom of the active region 534 and traversing bitlines 546a, 546b and wordline 558 and is provided in FIG. 12B.

As shown in FIGS. 12A, 12B, the floating gates 504a, 504b of adjacent cells are maintained isolated, while the control gates 512a, 512b of adjacent cells are joined as shown in FIG. 12A by contact 554. As shown, one contact 554 is provided for each double celled element 10. Contacts 554 of adjacent elements 10 are joined via wordline 558.

Figure 13:
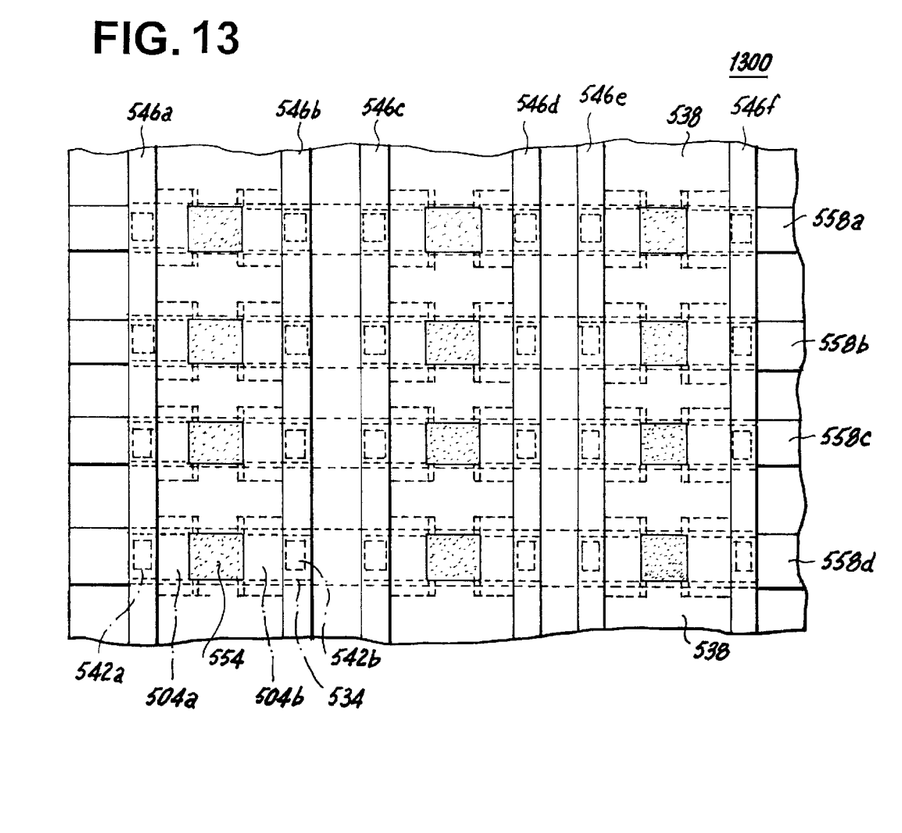
FIG. 13 is a top view shown partially in phantom of a flash memory array according to the present invention.

Referring to FIG. 13, a layout of an array 1300 of double cell elements 10 is shown. Each cell of each element 10 is in contact with one bitline of a plurality of vertically oriented bitlines 546a–f at the associated drain region 528a, 528b of the cell via the cell's associated contact 542a, 542b. Each cell of each element 10 is in contact with one wordline of a plurality of horizontally oriented wordlines 558a–d at the control gates 512a, 512b of the element 10 via the element's contact 554.

Array 1300 may be formed in accordance with the first embodiment wherein the array is a cross-point array, the bitlines form bitline pairs (546a, 546b), (546c, 546d), (546e, 546f) etc., each bitline pair carrying a differential signal pair, and a differential sense amplifier (not shown) being provided for each bitline pair. Array 1300 may alternatively be formed in accordance with the second embodiment, wherein each bitline 546a, 546b, 546c, etc. is an individual bitline and a single-end sense amplifier (not shown) is provided for each individual bitline 546a, 546b, 546c, etc.

The array 1300 may be slightly larger than the size of a conventional array of single cell elements, however each embodiment of array 1300 provides a particular advantage suited for a particular type of application. For low-power and high-speed applications the first embodiment of array 1300 provides high-programming speed and reliable read results. For applications requiring compact configurations the second embodiment of array 1300 provides close to double the density of memory cells as a conventional array of single cell elements, while providing the substantially the same speed.

It is contemplated that the above fabrication method can be used for the fabrication of an array of flash memory elements, wherein each flash memory element has one cell.

What has been described herein is merely illustrative of the application of the principles of the present invention. Other arrangements and methods may be implemented by those skilled in the art without departing from the scope and spirit of the invention.

What is claimed is:

1. A flash memory system comprising:
   a plurality of flash memory cell pairs arranged in an array,
      a flash memory cell pair of the plurality of flash memory cell pairs having first and second FETs having a common source, the first and the second FETs coupled to a wordline via a shared control gate;

a plurality of bitlines traversing the array including a first bitline connected to a drain region of the first FET and a second bitline connected to a drain region of the second FET; and a differential sense amplifier connected to the first and second bitlines for sensing a signal propagated along each of the first and second bitlines differentially.

2. A flash memory system comprising:

a plurality of flash memory cell pairs arranged in an array, a flash memory cell pair of the plurality of flash memory cell pairs having first and second FETs having a common source, the first and the second FETs coupled to a wordline via a shared control gate;

a plurality of bitlines traversing the array including a first bitline connected to a drain region of the first FET and a second bitline connected to a drain region of the second FET; and at least one sense amplifier, wherein the flash memory cell pair is adapted to be coupled to a plurality of sense amplifiers for sensing a signal propagated along each of the first and second bitlines independently, and the flash memory cell pair is further adapted to be coupled to a single sense amplifier for sensing a signal propagated along each of the first and second bitlines differentially.

3. The flash memory system of claim 2, wherein when the flash memory cell pair is coupled to a single sense amplifier, the one sense amplifier is a differential sense amplifier.

4. The flash memory system of claim 2, wherein when the flash memory cell pair is coupled to a single sense amplifier, the first and second FETs are programmed at a voltage substantially equal to a Vt of the first and second FETs, and when the flash memory cell pair is coupled to a plurality of sense amplifiers, the first and second FETs are programmed at a voltage higher than the Vt of the first and second FETs.

5. A flash memory system comprising:

a plurality of flash memory cell pairs arranged in an array, a respective one flash memory cell pair of the plurality of flash memory cell pairs having first and second FETs having a common source, the first and the second FETs coupled to a wordline via a shared control gate;

a plurality of bitlines traversing the array including a first bitline connected to a drain region of the first FET and a second bitline connected to a drain region of the second FET; and at least one sense amplifier, wherein the respective one flash memory cell pair is adapted to be coupled to a plurality of sense amplifiers for sensing a signal propagated along each of the first and second bitlines independently, and the respective one flash memory cell pair is further adapted to be coupled to a single sense amplifier for sensing a signal propagated along each of the first and second bitlines differentially.

* * * * *